US005382819A

United States Patent [19]

Honjo

[11] Patent Number: 5,382,819

[45] Date of Patent: Jan. 17, 1995

[54] SEMICONDUCTOR DEVICE HAVING MOS SOURCE FOLLOWER CIRCUIT

[75] Inventor: Atsushi Honjo, Tokyo, Japan

[73] Assignee: Kabushiki Kaisha Toshiba, Kanagawa, Japan

[21] Appl. No.: 974,471

[22] Filed: Nov. 12, 1992

[30] Foreign Application Priority Data

Nov. 12, 1991 [JP] Japan ................................ 3-295816

[51] Int. Cl.$^6$ ........................................ H01L 27/02

[52] U.S. Cl. .............................. 257/371; 257/373; 257/392; 257/393

[58] Field of Search ................ 257/392, 393, 371, 373

[56] References Cited

FOREIGN PATENT DOCUMENTS 61-2355 1/1986 Japan ................................ 257/393

*Primary Examiner*—Edward Wojciechowicz
*Attorney, Agent, or Firm*—Finnegan, Henderson, Farabow, Garrett & Dunner

[57] ABSTRACT

A semiconductor device having a source follower circuit is configurated in such a way that a first and a second p-type wells are formed by diffusing a p-type impurity into an n-type semiconductor substrate doped with an n-type impurity of a low density. Next, on the first well, a driver transistor of the source follower circuit and then, on the second well, a load transistor of the source follower circuit are formed. The first well and a source of the driver transistor are then connected to each other.

2 Claims, 5 Drawing Sheets

SEMICONDUCTOR DEVICE HAVING MOS SOURCE FOLLOWER CIRCUIT

BACKGROUND OF THE INVENTION

This invention relates to a semiconductor device having a MOS source follower circuit integrated on a semiconductor substrate.

FIG. 1 shows a MOS source follower circuit formed on a conventional semiconductor substrate. FIG. 2 illustrates the circuit diagram of the MOS source follower circuit which is shown in FIG. 1.

In FIG. 1 a p-well 102 is formed on a n-type semiconductor substrate 101 with a well known technique. On this single p-well, MOS transistors 103 and 104 are formed. The MOS transistor 103 is an enhancement-type driver transistor of the source follower circuit which has n+ areas 105 and 106 into which a high-density n-type impurity is diffused as a drain and a source, respectively, and also has a polycrystalline silicon electrode 107 as a gate electrode in structure. The MOS transistor 104 is a depletion-type load transistor of the source follower circuit which has n+ type areas 106 and 108 as a drain and a source, respectively, and also has a polycrystalline electrode 109 as a gate electrode in structure. Note here that in both transistors their gate oxide films are omitted in FIG. 1.

The drain 105 of the transistor 103 is connected to an electrode terminal $V_D$ with a wiring material such as aluminum, while the gate electrode 107 is connected to an input terminal $V_{IN}$ with the wiring material. The n+ area 106, which plays both the roles of the source of the transistor 103 and the drain of the transistor 104, is connected to an output terminal $V_{OUT}$. The source 108 and the gate 109 of the transistor 104 are connected to a point of reference potential. The semiconductor substrate 101 is connected to a substrate bias terminal $V_{sub}$, and to this substrate a prescribed bias voltage is applied. The p-well 102 is connected to the point of reference potential via p+ layers 110 and 111 which realize ohmic contact with the wiring material.

SUMMARY OF THE INVENTION

The object of this invention is to provide a source follower circuit which enables the setting of smaller input capacitance and also larger low-frequency gain.

To realize this object, a semiconductor device according to this invention comprises a specific conducting type semiconductor substrate, first and second wells of conducting type opposite to the conducting type of the semiconductor substrate, formed on the semiconductor substrate, a first transistor which is formed on the first well to work as a driver transistor of a source follower circuit, a second transistor which is formed on the second well to work as a load of the source follower circuit, and connection means which connects the first well and a source of the first transistor.

Also, to work out the abovementioned object, a method of manufacturing a semiconductor device according to this invention comprises the steps of forming, on a specific conducting type semiconductor substrate, first and second wells of conducting type opposite to the conducting type of the semiconductor substrate, forming, on the first well, a first transistor which works as a driver transistor of a source follower circuit, forming, on the second well, a second transistor which works as a load of the source follower circuit, and mutually connecting the first well and a source of the first transistor.

DETAILED DESCRIPTION OF THE PREFERRED EMBODIMENTS

Figure 3:
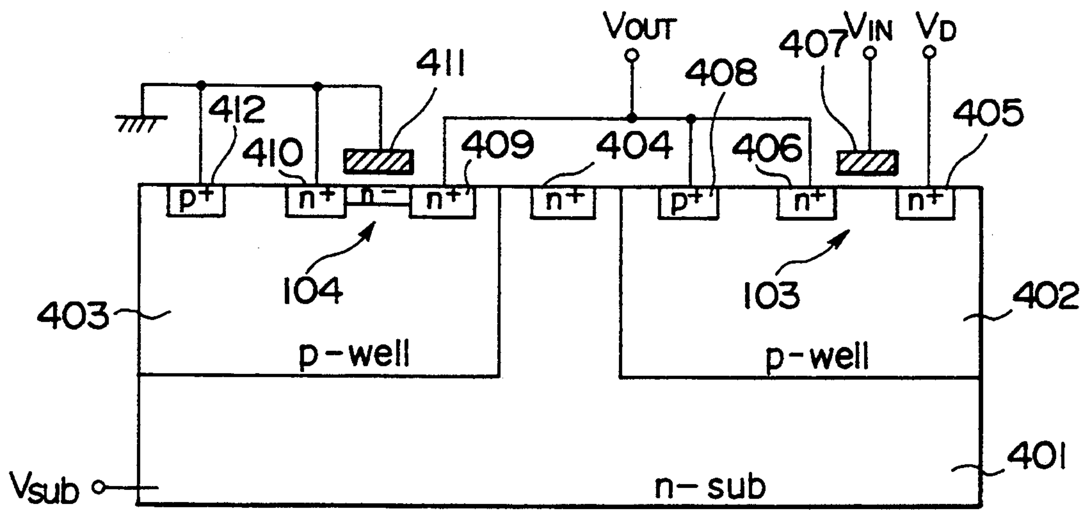
FIG. 3 is a cross-sectional view of a MOS source follower IC according to this invention.
Figure 4:
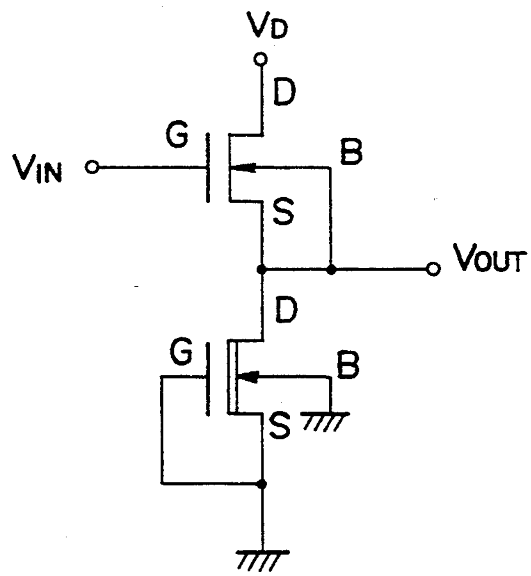
FIG. 4 is a circuit diagram of the MOS source follower IC as shown in FIG. 3.

FIG. 3 shows a source follower circuit which is formed on a semiconductor substrate according to this invention. FIG. 4 shows a circuit diagram of the source follower circuit shown in FIG. 3.

In FIG. 3, p-wells 402 and 403 are formed as a result of diffusing a p-type impurity on a n-type semiconductor substrate 401 doped with an n-type low-density impurity. To insure electric isolation between the two p-wells 402 and 403, a high-density impurity area, n+ layer 404, is formed between both areas. On the p-well 402 n+ layers 405 and 406 and a polycrystalline silicon electrode 407 form the drain, source, and-gate of an enhancement-type driver transistor 103. The drain 405 is connected to a power supply terminal $V_D$ with a wiring material such as aluminum. The source 406 is connected to a circuit output terminal $V_{OUT}$ with the wiring material. A circuit input terminal $V_{IN}$ is connected to the gate 407. The p-well 402 on which a driver transistor 103 has been formed is connected to a circuit output terminal $V_{OUT}$ via a p+ layer 408.

On the p-well 403, a n+ layer 409, n+ layer 410, and polycrystalline electrode 411 form the drain, source, and gate of a depletion-type load transistor 104. The drain 409 is connected to the circuit output terminal $V_{OUT}$ with a wiring material. Both the source 410 and the gate 411 are connected to a reference potential point of the IC. The p-well 403 is also connected to the reference potential point via the p+ layer 412. The semiconductor substrate 401 is connected to a substrate bias terminal $V_{SUB}$.

AC small-signal characteristics of the MOS source follower circuit of this invention are analyzed below.

Figure 5:
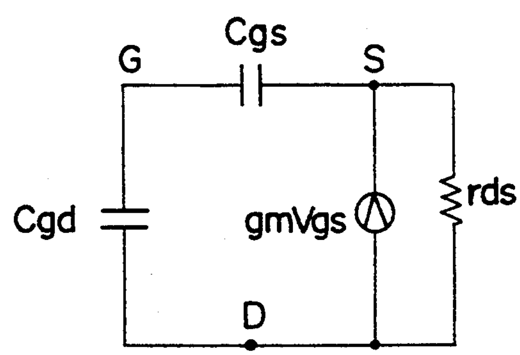
FIG. 5 is an AC small-signal equivalent circuit diagram of a MOS transistor.
Figure 6:
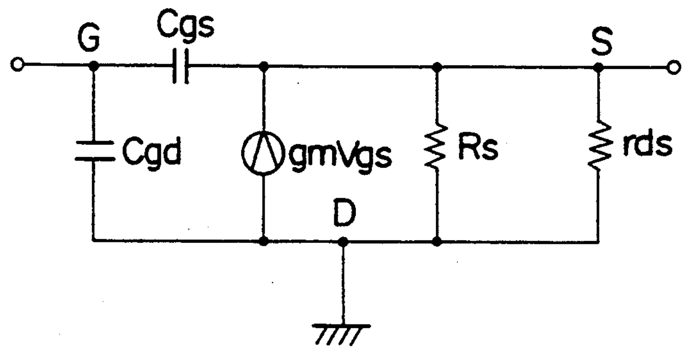
FIG. 6 is an equivalent circuit diagram of the MOS source follower circuit.

If the driver transistor 103 is replaced by an equivalent circuit shown in FIG. 5 and the load transistor 104 is replaced by an equivalent resistor $R_s$, an equivalent circuit of the MOS source follower circuit becomes as shown in FIG. 6. In FIGS. 5 and 6, $C_{gs}$ represents gate-source capacitance, $C_{gd}$ gate-drain capacitance, $g_m$ mutual conductance, $v_{gs}$ gate-source application voltage, and $r_{ds}$ drain-source resistance.

Figure 7:
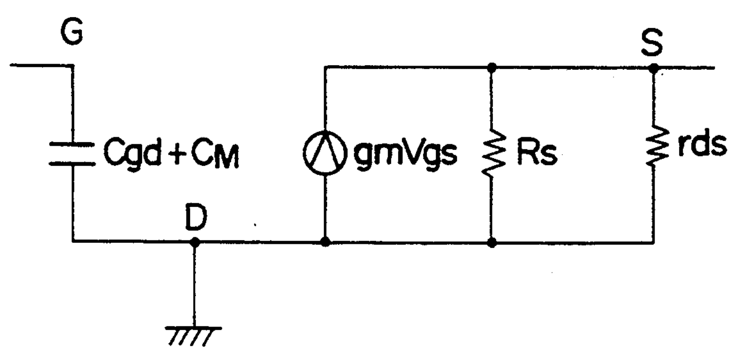
FIG. 7 is another equivalent circuit diagram of the MOS source follower circuit.

The equivalent circuit shown in FIG. 6 can be replaced by an equivalent circuit shown in FIG. 7 in a frequency band where $R_s//r_{ds} < |1/SC_{gs}|$ and $g_m > |SC_{gs}|$ are established. In FIG. 7, a capacitor $C_M$ is as follows:

$$C_M = C_{gs}/(1+(R_s//r_{ds})g_m)$$

Assuming that in this equivalent circuit an impedance of an input signal source is $r_i$, a voltage gain $A_v$ can be obtained as follows.

$$A_v = (R_s//r_{ds})g_m/(1+S(C_{gd}+C_M)r_i)\cdot(1+(R_s//r_{ds})g_m) \quad (1)$$

where a voltage gain $A_{vlow}$ is expressed by:

$$A_{vlow} = (R_s//r_{ds})g_m/(1+(R_s//r_{ds})g_m) \quad (2)$$

Input capacitance $C_{IN}$ is given by:

$$C_{IN} = C_{gd}+C_M = C_{gd}+C_{gs}/(1+(R_s//r_{ds})g_m) \quad (3)$$

These results prove that the input capacitance in the MOS source follower circuit is dependent on $(R_s//r_{ds})g_m$.

In the next place, drain source resistance $r_{ds}$ is considered below.

It is known that in a saturation area in which channel length modulation due to the drain-source voltage $V_{DS}$ and also $V_{th}$ fluctuation (back gate effect) due to the p-well-source voltage $V_{BS}$ are taken into account, the I-V characteristic of MOS transistors become as follows.

$$I_{DS} = (\beta/2)(V_{GS}-V_{th}-\gamma(2\phi_F-V_{BS})^{\frac{1}{2}})^2\cdot(1+\lambda V_{DS})$$

where $V_{GS}$ is the gate-source voltage, $\beta$ a constant dependent on the chip size, $\lambda$ is a channel-length modulation factor, $\gamma$ a factor (body factor) which represents the magnitude of the back gate effect, and $\phi_F$ represents a Fermi potential of the p-well. Based on this equation and using $\Delta$ as a partial differential operator, $r_{ds}$ is expressed by the following equation:

$$\begin{aligned}(1 + r_{ds}) &= (\Delta I_{DS}/\Delta V_{DS}) \quad (4)\\ &= (\beta/2)\lambda\,(V_{GS} - V_{th} - \gamma\,(2\phi_F - V_{BS})^{\frac{1}{2}})^2 + \\ &\quad (\beta/2)\gamma(V_{GS} - V_{th} - \gamma\,(2\phi_F - V_{BS})^{\frac{1}{2}}((1 + \lambda V_{DS})/\\ &\quad (2\phi_F - V_{BS})^{\frac{1}{2}})(\Delta V_{BS}/\Delta V_{DS})\end{aligned}$$

Here, the resistance $r\lambda$ due to the channel length modulation and the resistance $r\lambda$ due to the back gate effect are defined, respectively, as follows:

$$r_\lambda = ((\beta/2)\lambda(V_{GS}-V_{th}\gamma(2\phi_F-V_{BS})^{\frac{1}{2}})^2)^{-1} \quad (5)$$

$$r_\gamma = ((\beta/2)\gamma(V_{GS}-V_{th}-\gamma(2\phi_F-V_{BS})^{\frac{1}{2}})((1+\lambda V_{DS})/(2\phi_F-V_{BS})^{\frac{1}{2}}(\Delta V_{BS}/\Delta_{DS}))^{-1} \quad (6)$$

From equation (4), $r_{ds}$ becomes as follows:

$$r_{ds} = r\lambda//r\gamma \quad (7)$$

Equation (7) shows that $r_{ds}$ is given by parallel resistors $r\lambda$ and $r\gamma$.

In the source follower circuit according to this invention, as mentioned above, the p-well 402 is connected to the output terminal $V_{OUT}$ via the p+ layer 408, so that the p-well-source voltage $V_{BS}$ is always 0 (V). Therefore, the I-V characteristics of the transistor can be given as below using equation 4).

$$_{DS} = (\eta/2)(V_{GS}-V_{th}-\gamma(2\phi_F)^{\frac{1}{2}})^2(1+\lambda V_{GS}) \quad (8)$$

From equation (8), $r_{ds}$ is given as follows:

$$\begin{aligned}1/r_{ds} &= (\Delta I_{DS}/\Delta V_{DS}) \quad (9)\\ &= (\beta/2)\lambda\,(V_{GS} - V_{th} - \gamma\,(2\phi_F)^{\frac{1}{2}})^2\end{aligned}$$

From equation (5), $r\lambda$ can be defined as:

$$r = r\lambda \quad (10)$$

Equation (10) indicates that the back gate effect avoided and that $r\gamma$ has become $\infty$.

Consequently this invention increases the drain-source resistance $r_{ds}$ and then $(R_s//r_{ds})g_m$, so that the low-frequency voltage gain $A_{vlow}$ and the input capacitance $C_{IN}$ of the MOS source follower circuit which are given in equations (2) and (3), respectively, are improved.

On a sample of the MOS source follower circuit according to this invention in such conditions as, for example, 900-angstrom oxide film width, 15-μm channel width W of the driver transistor, 10 μm channel length L, 0 (zero) threshold voltage Vth, 80-μm channel width W of the load transistor, 30-μm channel length L, −2.5 V threshold voltage Vth, $1.3\times10^{15}/cm^3$ surface density of the p-well, and $V_D=V_{IN}=15$ (V), electric measurements were as follows:

$$g_m = 1.5\times10^{-4}(s); R_s = 610(k\Omega); r_{ds} = 200\ (k\Omega)$$

Subsequently, $(R_s//r_{ds})g_m = 22.6$. From equations (2) and (3), the following are obtained.

$$A_{vlow} = 22.6/(1+22.6) = 0.96; C_{IN} = 3.3\times10^{15}(F)$$

As clear from equation (1), these results contribute to improvements of the frequency response of the source follower circuit.

Figure 8:
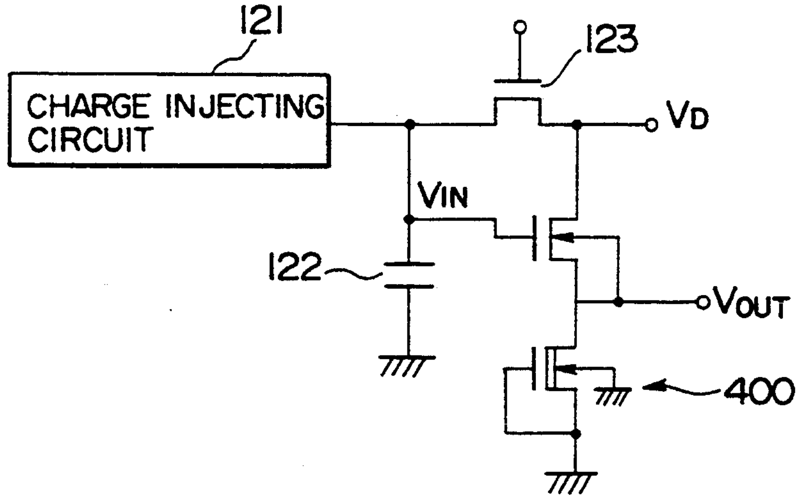
FIG. 8 is a circuit diagram of another embodiment according to this invention.

FIG. 8 illustrates an example in which the source follower circuit according to this invention is employed to configurate a circuit that converts the number of electrons to voltage. This configuration is realized by combining a charge injecting circuit 121, which is made up of a charge coupler (not illustrated), etc. to inject signal charges to a capacitor 122, a source follower circuit 400 which converts charges stored in the capacitor 122 to a voltage signal, and a switch 123 which connects an input terminal with a power supply terminal $V_D$.

Moreover, the p-well of the driver transistor in the source follower circuit 400 is connected to an output terminal $V_{OUT}$.

The operation of the circuit shown in FIG. 8 is described here. First the switch 123 is opened to set an input voltage $V_{IN}$ in the source follower circuit 400 to $V_D$ (V), and then this switch 123 is closed. Next, the charge injecting circuit 121 injects N number of electrons to the input terminal. The N number of electrons have −Nq (C) if the elementary quantity of charges is denoted by q (C), resulting in a voltage drop, ΔV (V), given by the following equation:

$$\Delta V = qN/(C_{st}+C_{IN})$$

where $C_{st}$ (F) represents capacitance of the capacitor 122, and $C_{IN}$ (F) input capacitance of the source follower circuit 400.

This voltage drop ΔV brings about the following changes in an output voltage $V_{OUT}$ of the source follower circuit 400.

This voltage drop ΔV brings about the following changes in an output voltage $V_{OUT}$ of the source follower circuit 400.

$$\begin{aligned}\Delta V_{OUT} &= \Delta V \cdot A_v \\ &= qN \cdot A_v/(C_{st} + C_{IN})\end{aligned}$$

In the low-frequency band, the following voltage drop is given.

$$\begin{aligned}\Delta V_{OUT} &= \Delta V \cdot A_{vlow} \\ &= qN \cdot A_{vlow}/(C_{st} + C_{IN})\end{aligned}$$

where $A_{vlow}$ represents the low-frequency band gain of the source follower circuit.

In such a way, this circuit configuration converts the N number of electrons into a voltage change $\Delta V_{OUT}$. The factor G of converting the number of electrons into voltage of this circuit is given as:

$$G = \Delta V_{OUT}/N = qA_{vlow}/(C_{st} + C_{IN}) \quad (11)$$

Assuming that the capacitance $C_{st}$ of the capacitor 122 is 0.005 (pF) and that this value is substituted together with the low-frequency band gain $A_{vlow}$ and the input capacitance $C_{IN}$ given as above into equation 11, the factor G of converting the number of electrons to voltage is obtained as follows.

$$\begin{aligned}G &= qA_{vlow}/(C_{st} + C_{IN}) \\ &= 1.6 \times 10^{-19}\,(C) \times 0.96/(0.005(pF) + 0.0033(pF)) \\ &= 1.9 \times 10^{-5}\ (\text{V/electron})\end{aligned}$$

Figure 1:
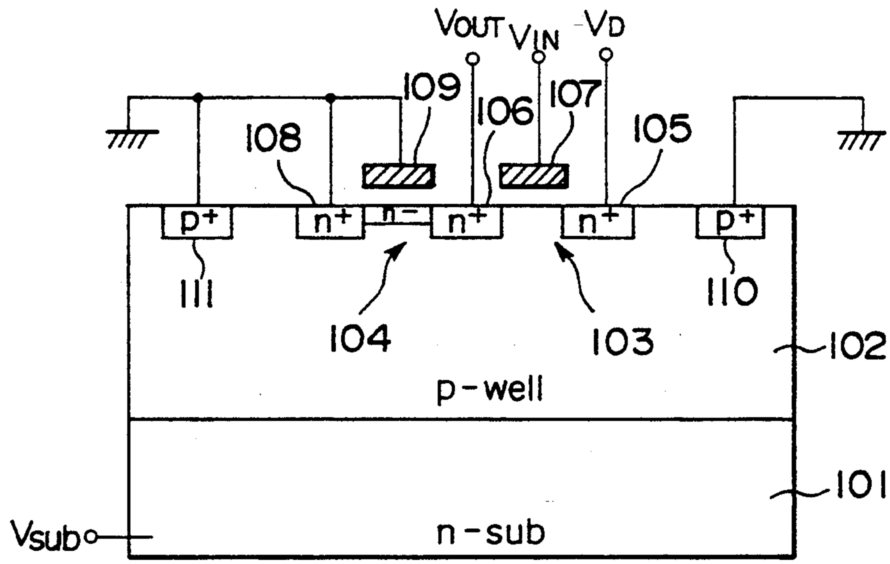
FIG. 1 is a cross-sectional view of a conventional MOS source follower IC.
Figure 2:
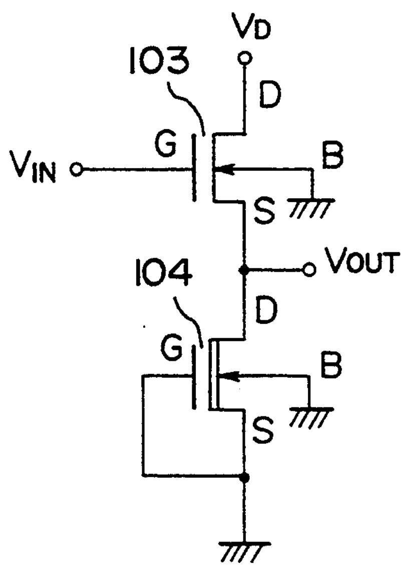
FIG. 2 is a circuit diagram of the MOS source follower IC shown in FIG. 1.

Here, MOS transistors having the same parameters as those of the MOS transistors in the trially made samples of the source follower circuit made trially according to this invention are used to configure the conventional source follower circuit shown in FIGS. 1 and 2 in order to compare those source follower circuits in terms of the AC small-signal characteristics.

Concerning AC small signals, the equivalent circuits of the conventional source follower circuits are respectively the same as those of the source follower circuits according to this invention which are shown in FIGS. 5, 6, and 7. Therefore, equations (1) to (11) which are led by analyzing those equivalent circuits shown in FIGS. 5, 6, and 7 can be applied to the conventional source follower circuits.

In fact, electric measurements of trially made samples of the conventional circuit became as follows:

$$g_m = 1.5 \times 10^{-4}(S); R_s = (k\Omega); r_{ds} = 51(k\Omega)$$

Hence, $(R_s // r_{ds})g_m = 7.1$, and the voltage gain $A_{vlow}$ in the low-frequency band $= 7.1/(1+7.1) = 0.88$, considerably smaller than 1. Furthermore actual measurements of capacitance in the same sizes are:

$$C_{gd} = 1.7 \times 10^{-15}(F); C_{gs} = 3.9 \times 10^{-14}(F)$$

The input capacitance $C_{IN}$ led from equation (3) is considerably large as follows.

$$\begin{aligned}C_{IN} &= 1.7 \times 10^{-15} + 3.9 \times 10^{-14}/8.1 \\ &= 6.5 \times 10^{-15}\,(F)\end{aligned}$$

Figure 9:
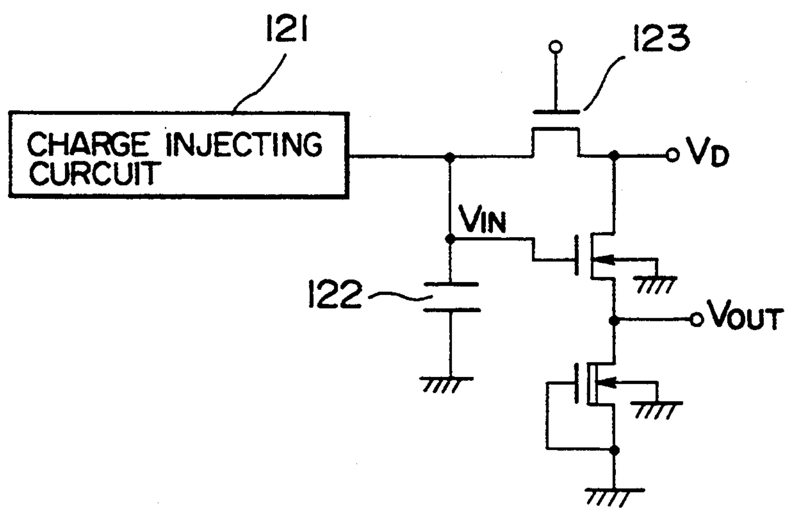
FIG. 9 is a circuit diagram of another conventional MOS source follower circuit.

As shown in FIG. 9, a circuit which converts the number of electrons into voltage was configurated using the conventional source follower circuit. Assuming that capacitance $C_{st}$ of the capacitor 122 is 0.005 (pF), the values of the lower-frequency band gain $A_{vlow}$ and the input capacitance $C_{IN}$ given as above are substituted into equation (11), obtaining the following result:

$$\begin{aligned}G &= 1.6 \times 10^{-19} \times 0.88(C)/(0.005 + 0.0065)(pF) \\ &= 1.2 \times 10^{-5}\ (\text{V/electron})\end{aligned}$$

Accordingly, this invention has improved the value of G about 1.6 times as much as that of the conventional source follower circuit. The everlasting improvements in manufacturing of IC circuits have brought about finer patterning which is expected to decrease the value of $C_{st}$ still more, and the rate of improvement is considered to become increasingly noticeable.

In the abovementioned semiconductor device according to this invention, as described above, a driver transistor is formed on one of the two p-wells isolated from each other and, a load transistor is formed on the other p-well to realize a source follower circuit. Moreover, the voltage of the source of the driver transistor is set to the same voltage of the well that carries the driver transistor. As a result, preferably, the lower-frequency band voltage gain $A_{vlow}$ of the MOS source follower circuit is improved and their input capacitance $C_{IN}$ decreases.

What is claimed is:

1. A semiconductor device comprising:

a specific conducting type semiconductor substrate;

first and second wells of conducting type opposite to the conducting type of the semiconductor substrate, formed on the semiconductor substrate;

a first transistor formed on the first well to act as a driver transistor of a source follower circuit;

a second transistor having the same semiconductor type as that of the first transistor, formed on the second well to act as a load transistor of the source follower circuit; and connection means for connecting the first well and a source of the first transistor to each other.

2. A semiconductor device as set forth in claim 1, comprising:

a capacitor connected between a gate of the driver transistor and a power supply or a reference potential point; and charge supplying means for supplying electric charges to the capacitor corresponding to an input signal.

* * * * *